United States Patent
Kitazawa

(10) Patent No.: US 10,804,695 B2
(45) Date of Patent: Oct. 13, 2020

(54) LEVEL SHIFTER AND ELECTRONIC APPARATUS

(71) Applicant: SEIKO EPSON CORPORATION, Tokyo (JP)

(72) Inventor: Takeo Kitazawa, Azumino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 242 days.

(21) Appl. No.: 16/114,575

(22) Filed: Aug. 28, 2018

(65) Prior Publication Data

US 2019/0067936 A1 Feb. 28, 2019

(30) Foreign Application Priority Data

Aug. 29, 2017 (JP) .................. 2017-164249

(51) Int. Cl.
| | | |
|---|---|---|
| *H02H 9/04* | (2006.01) | |
| *H03K 19/0175* | (2006.01) | |
| *H03K 19/0185* | (2006.01) | |
| *H01L 27/02* | (2006.01) | |
| *H03K 3/356* | (2006.01) | |

(52) U.S. Cl.
CPC ........... *H02H 9/04* (2013.01); *H01L 27/0255* (2013.01); *H02H 9/046* (2013.01); *H03K 3/356113* (2013.01); *H03K 19/017509* (2013.01); *H03K 19/018521* (2013.01)

(58) Field of Classification Search
CPC .. H02H 9/04; H02H 9/041; H02H 9/044–046; H01L 27/0255; H01L 27/0259; H01L 27/0266; H03K 3/356113; H03K 3/35613; H03K 19/017509; H03K 19/017527; H03K 19/017545; H03K 19/017563; H03K 19/01812;
(Continued)

(56) References Cited

U.S. PATENT DOCUMENTS

| | | | | |
|---|---|---|---|---|
| 6,373,285 B1 * | 4/2002 | Konishi | .................... | G06J 1/00 326/68 |
| 7,005,908 B2 * | 2/2006 | Lee | .................. | H03K 3/356113 326/68 |

(Continued)

FOREIGN PATENT DOCUMENTS

JP 2007-027676 A 2/2007

OTHER PUBLICATIONS

CN 201710030675.4 for priority purposes of US 2018/0205379. Jan. 16, 2017. (Year: 2017).*

*Primary Examiner* — Jared Fureman
*Assistant Examiner* — Christopher J Clark
(74) *Attorney, Agent, or Firm* — Oliff PLC

(57) ABSTRACT

A first circuit and a second circuit, which have different operating voltages, are connected through a level shifter, and a combination circuit below is provided in the level shifter. An enable signal, which is switched between active and inactive states according to whether or not a potential is supplied to a second high potential power line, is applied to the combination circuit. The combination circuit outputs a first signal and a second signal, which is acquired by logically inverting the first signal, to a level shift circuit according to an output signal of the first circuit, in a case where the enable signal is active, and causes both the first signal and the second signal to be at a low level in a case where the enable signal is inactive.

10 Claims, 3 Drawing Sheets

(58) Field of Classification Search
CPC .. H03K 19/01831; H03K 19/018507–018528;
H03K 19/018557–018578
See application file for complete search history.

(56) References Cited

U.S. PATENT DOCUMENTS

| | | |
|---|---|---|
| 7,233,468 B2 | 6/2007 | Chang et al. |
| 9,257,973 B1* | 2/2016 | Shay ................ H03K 3/356104 |
| 2004/0135206 A1* | 7/2004 | Kato ................... H01L 27/0266 |
| | | 257/355 |
| 2010/0109743 A1* | 5/2010 | Czech ................. H03K 17/102 |
| | | 327/333 |
| 2018/0205379 A1* | 7/2018 | Yang ................. H03K 3/35625 |

* cited by examiner

ENABLE SIGNAL EN: ACTIVE

| INS | S1 | S2 |
|-----|----|----|
| 0   | 0  | 1  |
| 1   | 1  | 0  |

ENABLE SIGNAL EN: INACTIVE

| INS | S1 | S2 |
|-----|----|----|
| 0   | 0  | 0  |
| 1   | 0  | 0  |

US 10,804,695 B2

LEVEL SHIFTER AND ELECTRONIC APPARATUS

CROSS-REFERENCES TO RELATED APPLICATIONS

This application claims priority to Japanese Patent Application No. 2017-164249, filed Aug. 29, 2017, the entirety of which is herein incorporated by reference.

BACKGROUND

1. Technical Field

The present invention relates to a signal transmission technology between circuits having different supply voltages.

2. Related Art

Generally, a digital circuit and an analog circuit have different supply voltages, for example, in a state in which the former has a supply voltage of 3.3 V and the latter has a supply voltage of 12 V. In signal transmission between circuits having different supply voltages, such as in signal transmission between the digital circuit and the analog circuit, a level shift circuit is necessary. In addition, in a case where the signal transmission is performed between the circuits having different supply voltages, it is necessary to provide a protection circuit in a fore stage of the level shift circuit such that a high voltage pulse, which is generated along with Electro-Static Discharge (ESD) (hereinafter, referred to as "ESD"), is prevented from destructing an inside circuit of a semiconductor chip or from causing malfunction.

JP-A-2007-27676 discloses a technology which realizes ESD countermeasures by providing a protection circuit including a protection element 260 and a protection circuit including a protection element 270 in a fore stage of the shift circuit 250, as illustrated in FIG. 7. In the technology disclosed in JP-A-2007-27676, in a case where the ESD is generated on a low potential side (VDD1 side) in which the supply voltage is low and a high voltage pulse overlaps an output signal 211 or an output signal 241 from the low potential side, a current according to the high voltage pulse flows to the power line VDD2 on a high potential side in which the supply voltage is high, through the protection element 260 or the protection element 270. Therefore, the high voltage pulse is avoided being applied to gates of a level shift circuit 250 (specifically, gates of respective field effect transistors T2, T3, T5, and T6), and thus destruction of the gate is prevented.

In the technology disclosed in JP-A-2007-27676, a switch 280 and a switch 290 are disposed on the low potential side, respectively, when viewed from the protection element 260 and the protection element 270, respectively. Therefore, the ESD is generated on the low potential side. In a case where the high voltage pulse overlaps the output signal 211 or the output signal 241, the high voltage pulse is applied to the switch 280 or the switch 290, and thus there is a possibility that the switch 280 or the switch 290 is damaged. In a case where the switch 280 or the switch 290 is damaged, the output signal 211 or the output signal 241 from the low potential side does not delivered to the level shift circuit 250, and thus a whole system does not operate. In order to avoid generation of such a situation, it is conceivable that the switch 280 and the switch 290 are not provided. In this case, the following problems are generated.

That is, in a case where a situation, in which a supply voltage on the low potential side is applied and a supply voltage on the high potential side is not applied, such as a case where an inner circuit 210 on the low potential side is constantly operated and an inner circuit 230 on the high potential side is intermittently operated, is generated, there is a problem in that a leak current, which flows to the power line VDD2 through the protection element 260 or the protection element 270, is generated according to timing. The reason for this is that, in a situation in which the supply voltage on the high potential side is not applied, a potential of the power line VDD2 is substantially 0 and one of the output signal 211 and the output signal 241 is at a high level (a potential of the power line VDD1) because the output signal 211 and the output signal 241 are differential signals. For example, the leak current flows through the protection element 260 in a case where the signal 241 is at the high level and the leak current flows through the protection element 270 in a case where the signal 211 is at the high level.

SUMMARY

An advantage of some aspects of the invention is to reduce a leak current which flows through a protection circuit provided for ESD countermeasures in a level shift circuit which mediates signal transmission between the circuits having different supply voltages.

A level shifter according to an aspect of the invention receives an input signal, which has a first high potential at a high level and a first low potential at a low level, from a first circuit, performs level shift on the input signal, and outputs an output signal, which has a second high potential at the high level and a second low potential at the low level, to a second circuit. The level shifter includes: a combination circuit to which the first high potential and the first low potential are applied as power source potentials, and which outputs a first signal and a second signal; and a level shift circuit to which the second high potential and the second low potential are applied as the power source potentials, and which generates the output signal according to the first signal and the second signal, in which the second high potential is higher than the first high potential, in which an enable signal is applied to the combination circuit, which has a logical level that is active in a case where the second high potential is applied to the level shift circuit and which has a logical level that is inactive in a case where the second high potential is not applied to the level shift circuit, and in which the combination circuit causes both the first signal and the second signal to be at the low level in a case where the enable signal is inactive, and causes one of the first signal and the second signal to be at the high level and the other signal to be at the low level in a case where the enable signal is active.

According to the aspect of the invention, in a situation in which the second high potential is not applied to the level shift circuit and the second circuit is not operated, the enable signal is inactive, and thus both the first signal and the second signal are at the low level. Therefore, even in a case where the protection circuit disclosed in JP-A-2007-27676 is provided on a fore stage of the level shift circuit, it is possible to reduce the leak current which flows through the protection circuit under the situation. That is, according to the aspect of the invention, it is possible to reduce the leak current which flows through the protection circuit provided on the fore stage of the level shift circuit for ESD countermeasures. In addition, according to the aspect of the invention, it is possible to intermittently operate the circuit on the high potential side.

In the level shifter, it is preferable that the combination circuit is configured to output the first signal, which has a logical level that is the same as a logical level of the input signal in a case where the enable signal is active, to output the first signal, which has a logical level at the low level in a case where the enable signal is inactive, to output the second signal which has a logical level acquired by inverting the logical level of the input signal in a case where the enable signal is active, and to output the second signal which has a logical level at the low level in a case where the enable signal is inactive.

According to the aspect with this configuration, in a case where the enable signal is active, the first signal has the same logical level as the output signal of the first circuit, and the second signal has the logical level acquired by logically inverting the first signal. In a case where the enable signal is inactive, both the first signal and the second signal are at the low level.

A specific configuration of the combination circuit in a case where an active level of the enable signal is at a high level is configured to include an inverter to which the enable signal is input, a first NOR gate to which the input signal and an output signal of the inverter are input, and which outputs the second signal, and a second NOR gate to which the output signal of the first NOR gate and the output signal of the inverter are input, and which outputs the first signal.

It is preferable that the level shifter further include a first protection circuit which is connected to an output end of the first signal in the combination circuit and an input end of the first signal in the level shift circuit; and a second protection circuit which is connected to an output end of the second signal in the combination circuit and an input end of the second signal in the level shift circuit. As a specific configuration of the first protection circuit and the second protection circuit, a configuration with which the first protection element, a second protection element, and the resistor are combined may be exemplified. The resistor is connected to an input end of a signal which is output from the combination circuit and an output end of a signal which is output to the level shift circuit. The first protection element includes a first terminal to which the second high potential is supplied as a high power source potential, and a second terminal which is connected to the output end of the signal to be output to the level shift circuit, and causes a current to flow in a direction from the second terminal to the first terminal in a case where a potential of the second terminal is higher than a potential of the first terminal. The second protection element includes a first terminal which is connected to the output end of the signal to be output to the level shift circuit, and a second terminal to which the second low potential is supplied as a low power source potential, and causes the current to flow in a direction from the second terminal to the first terminal in a case where the potential of the second terminal is higher than the potential of the first terminal. Furthermore, in the level shifter according to the aspect, it is preferable that a potential difference between the first low potential and the second low potential is smaller than a forward voltage of the first protection element and is smaller than a forward voltage of the second protection element. Here, the forward voltage is a voltage between the second terminal and the first terminal, and is a voltage which cause the current that flows from the second terminal to the first terminal to rapidly increase.

According to the aspect with this configuration, even in a case where the ESD is generated on the low potential side and a positive high voltage pulse overlaps the first signal or the second signal, the current according to the high voltage pulse flows to a second high potential side through the first protection element in the first protection circuit or the second protection circuit. In addition, even in a case where a negative high voltage pulse overlaps the first signal or the second signal, the current according to the high voltage pulse flows to the first low potential power line through the second protection element in the first protection circuit or the second protection circuit. Therefore, in a case where the level shift circuit has a configuration as the level shift circuit 250 disclosed in JP-A-2007-27676, the high voltage pulse is avoided being applied to the gates, and thus destruction of the gates is prevented. In addition, according to the aspect, in a situation in which the supply voltage on the high potential side is not applied, the potential of the first terminal of the first protection element is the second low potential, and the potential of the second terminal of the first protection element is the first low potential. In contrast, the potential of the first terminal of the second protection element is the first low potential, and the potential of the second terminal of the second protection element is the second low potential. In a case where the second low potential is higher than the first low potential, there is not a case where the leak current flows through the first protection element. In addition, since the voltage between the second terminal and the first terminal is lower than the forward voltage in the second protection element, there is not a case where a large leak current flows through the second protection element. In a case where the first low potential is higher than the second low potential, there is not a case where the leak current flows through the second protection element. Since the voltage between the second terminal and the first terminal is also lower than the forward voltage in the first protection element, there is not a case where the large leak current flows through the first protection element.

In the level shifter, it is preferable that the first low potential is the same as the second low potential. According to the aspect, in a case where the first signal or the second signal is at the low level, it is possible to set the leak current, which flows through the first protection element or the second protection element, to 0. In addition, according to the aspect, it is possible to make the first low potential power line and the second low potential power line a common power line.

In addition, it is possible to realize the invention as an electronic apparatus which includes the level shifter, in addition to as the level shifter.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment of the invention will be described with reference to the accompanying drawings below.

Embodiment

Figures 1, 2, 3:
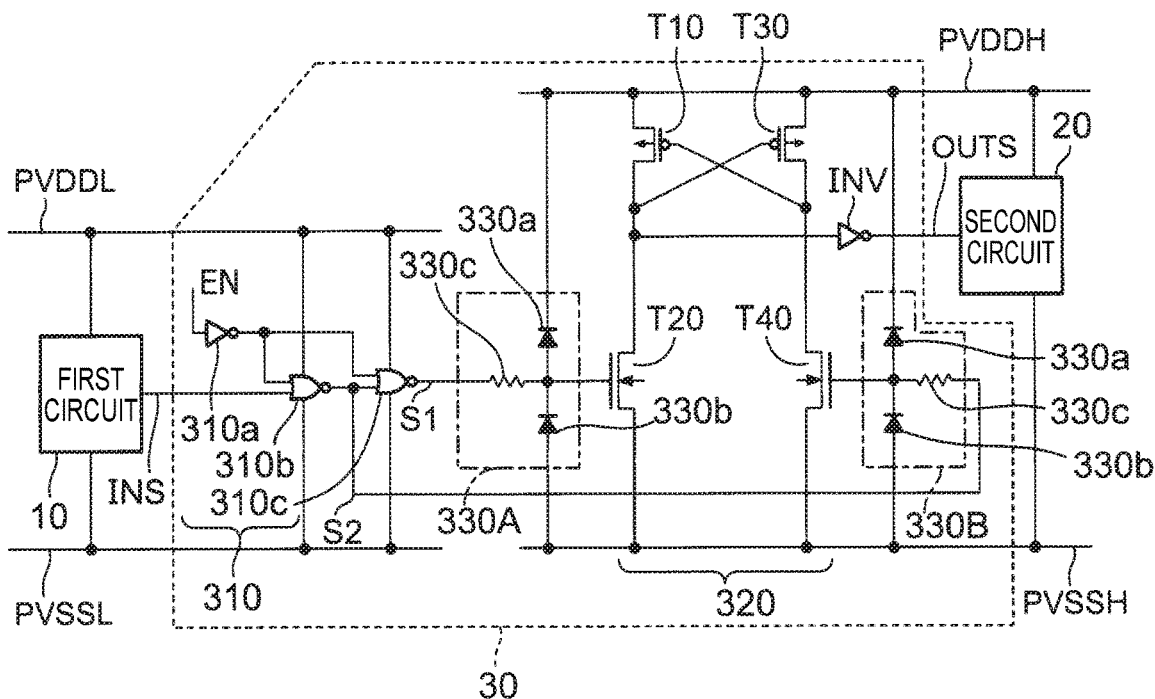
FIG. 1 is a diagram illustrating a configuration example of a level shifter according to an embodiment of the invention.
FIG. 2 is a diagram illustrating a first signal and a second signal, which are output from a combination circuit, in a case where an enable signal is active.
FIG. 3 is a diagram illustrating the first signal and the second signal, which are output from the combination circuit, in a case where the enable signal is inactive.

FIG. 1 is a diagram illustrating a configuration example of a level shifter 30 according to an embodiment of the invention.

The level shifter 30 mediates exchange of a signal between a first circuit 10 and a second circuit 20 which have operating voltages different from each other. The first circuit 10 is, for example, a digital circuit, and is connected to a first high potential power line PVDDL and a first low potential power line PVSSL. A potential VDDL of the first high potential power line PVDDL is higher than a potential VSSL of the first low potential power line PVSSL, and a potential difference between the potential VDDL and the potential VSSL is the operating voltage of the first circuit 10. The first circuit 10 outputs an input signal INS which has the potential VDDL at a high level and a potential VSSL at a low level.

The second circuit 20 is, for example, an analog circuit, and is connected to a second high potential power line PVDDH and a second low potential power line PVSSH. A potential VDDH of the second high potential power line PVDDH is higher than a potential VSSH of the second low potential power line PVSSH, and the potential difference between the potential VDDH and the potential VSSH is the operating voltage of the second circuit 20. In the embodiment, the potential VDDH is higher than the potential VDDL. Hereinafter, the potential VDDL is referred to as a "first high potential" and the potential VDDH is referred to as a "second high potential". In the same manner, hereinafter, the potential VSSL is referred to as a "first low potential" and the potential VSSH is referred to as a "second low potential". Meanwhile, in the embodiment, the first low potential and the second low potential are the same potential. A signal OUTS, which has the second high potential at the high level and has the second low potential at the low level, is input to the second circuit 20.

As illustrated in FIG. 1, the level shifter 30 is connected to the first circuit 10 and the second circuit 20. The input signal INS is input to the level shifter 30 from the first circuit 10. The level shifter 30 performs level shift on the input signal INS, generates the signal OUTS, and applies the signal OUTS to the second circuit 20. As illustrated in FIG. 1, the level shifter 30 includes a combination circuit 310, a level shift circuit 320, a protection circuit 330A, and a protection circuit 330B. The combination circuit 310 is connected to the first high potential power line PVDDL and the first low potential power line PVSSL, and the level shift circuit 320 is connected to the second high potential power line PVDDH and the second low potential power line PVSSH. The first high potential and the first low potential are applied to the combination circuit 310 as a power source potential, and the second high potential and the second low potential are applied to the level shift circuit 320 as the power source potential.

An enable signal EN is input to the combination circuit 310 as well as the input signal INS is input from the first circuit 10. The enable signal EN is a signal on which switching between logical levels (switching between active and inactive) is performed according to whether or not the potential VDDH is applied to the second high potential power line PVDDH (that is, according to whether or not the second high potential is applied to the level shift circuit 320). In the embodiment, in a case where a power source on a high potential side is on and the second high potential is applied to the level shift circuit 320, the enable signal EN is active. In a case where the same power source is off, the enable signal EN is inactive. In the embodiment, a case where the enable signal EN is active indicates a case where the logical level of the enable signal EN is the high level (the first high potential) and a case where the enable signal EN is inactive indicates a case where the logical level of the enable signal EN is the low level (the first low potential).

As illustrated in FIG. 1, the combination circuit 310 according to the embodiment includes an inverter 310a, a NOR gate 310b which is a first NOR gate, and a NOR gate 310c which is a second NOR gate. The enable signal EN is input to the inverter 310a. The inverter 310a outputs a signal which is acquired by inverting the enable signal EN. The input signal INS and the output signal of the inverter 310a are input to the NOR gate 310b, and the NOR gate 310b outputs a signal which is acquired by inverting a logical sum of the both signals. As illustrated in FIG. 1, in the embodiment, the output signal of the NOR gate 310b is a second signal S2. As illustrated in FIG. 2, in a case where the enable signal EN is active, the signal S2 is a signal which is acquired by inverting a logical level of the input signal INS. In contrast, in a case where the enable signal EN is inactive, the signal S2 is at the low level regardless whether the input signal INS is at the high level or at the low level, as illustrated in FIG. 3.

The second signal S2 and the output signal of the inverter 310a are input to the NOR gate 310c, and the NOR gate 310c outputs a signal which is acquired by inverting a logical sum of the both signals. As illustrated in FIG. 1, in the embodiment, the output signal of the NOR gate 310c is the first signal S1. As illustrated in FIG. 2, in a case where the enable signal EN is active, the signal S1 is a signal which is acquired by inverting a logical level of the signal S2, that is, a signal which is at the same logical level as the input signal INS. In contrast, in a case where the enable signal EN is inactive, the signal S1 is at the low level regardless that the input signal INS is at the high level or the low level, as illustrated in FIG. 3.

That is, in a case where the enable signal EN is active, the combination circuit 310 outputs the first signal S1, which is at the same logical level as the input signal INS, and the second signal S2 which is acquired by inverting the first signal S1. Furthermore, in a case where the enable signal EN is inactive, the combination circuit 310 causes the first signal S1 and the second signal S2 to be at the low level.

The level shift circuit 320 outputs the signal OUTS, which has the second high potential at the high level and the second low potential at the low level, according to the first signal S1 and the second signal S2. As illustrated in FIG. 1, the level shift circuit 320 includes P-channel field effect transistors T10 and T30 and N-channel field effect transistors T20 and T40.

The P-channel field effect transistor T10 and the N-channel field effect transistor T20 are interposed between the second high potential power line PVDDH and the second low potential power line PVSSH in series. More specifically, a source of the P-channel field effect transistor T10 is connected to the second high potential power line PVDDH, and a drain of the P-channel field effect transistor T10 is connected to a drain of the N-channel field effect transistor T20. Furthermore, a source of the N-channel field effect transistor T20 is connected to the second low potential power line PVSSH. The P-channel field effect transistor T30 and the N-channel field effect transistor T40 are also interposed between the second high potential power line PVDDH and the second low potential power line PVSSH in series. More specifically, a source of the P-channel field effect transistor T30 is connected to the second high potential power line PVDDH, and a drain of the P-channel field effect transistor T30 is connected to a drain of the N-channel field effect transistor T40. Furthermore, a source of the N-channel field effect transistor T40 is connected to the second low potential power line PVSSH.

A gate of the P-channel field effect transistor T10 is connected to a common connection point between the drain of the P-channel field effect transistor T30 and the drain of the N-channel field effect transistor T40. The gate of the P-channel field effect transistor T30 is connected to a common connection point between the drain of the P-channel field effect transistor T10 and the drain of the N-channel field effect transistor T20. The first signal S1 is applied to a gate of the N-channel field effect transistor T20 through the protection circuit 330A, and the second signal S2 is applied to a gate of the N-channel field effect transistor T40 through the protection circuit 330B.

An inverter INV is connected to the common connection point between the drain of the P-channel field effect transistor T10 and the drain of the N-channel field effect transistor T20, and the inverter INV outputs a potential, which is acquired by inverting a potential of the common connection point between the drain of the P-channel field effect transistor T10 and the drain of the N-channel field effect transistor T20, to the second circuit 20 as the signal OUTS.

As illustrated in FIG. 2, in a situation in which the enable signal EN is active, the signal levels of the first signal S1 and the second signal S2 change according to the signal level of the input signal INS. Specifically, in a case where the input signal INS is at the high level, the first signal S1 is at the high level and the second signal S2 is at the low level. In a case where the first signal S1 is at the high level and the second signal S2 is at the low level, the N-channel field effect transistor T20 is on and the N-channel field effect transistor T40 is off. Since the N-channel field effect transistor T20 is on, the potential of the common connection point between the drain of the P-channel field effect transistor T10 and the drain of the N-channel field effect transistor T20 is the potential of the second low potential power line PVSSH, that is, the low level. Therefore, the signal OUTS (potential which is acquired by logically inverting the potential of the common connection point by the inverter INV) is at the high level. Meanwhile, since the potential of the common connection point between the drain of the channel field effect transistor T10 and the drain of the N-channel field effect transistor T20 is at the low level, the P-channel field effect transistor T30 is on. Therefore, the potential of the common connection point between the drain of the P-channel field effect transistor T30 and the drain of the N-channel field effect transistor T40 is the potential of the second high potential power line PVDDH, and thus the P-channel field effect transistor T10 is off.

In contrast, in a case where the input signal INS is at the low level under a situation in which the enable signal EN is active, the first signal S1 is at the low level and the second signal S2 is at the high level. In a case where the first signal S1 is at the low level and the second signal S2 is at the high level, the N-channel field effect transistor T20 is off and the N-channel field effect transistor T40 is on. Since the N-channel field effect transistor T40 is on, the potential of the common connection point between the drain of the P-channel field effect transistor T30 and the drain of the N-channel field effect transistor T40 is the potential of the second low potential power line PVSSH and the P-channel field effect transistor T10 is on. Since the P-channel field effect transistor T10 is on and the N-channel field effect transistor T20 is off, the potential of the common connection point between the drain of the P-channel field effect transistor T10 and the drain of the N-channel field effect transistor T20 is the potential of the second high potential power line PVDDH, that is, the high level, and the signal OUTS is at the low level. At this time, the P-channel field effect transistor T30 is off.

As described above, under the situation in which the enable signal EN is active, the input signal INS, which is output from the first circuit 10, is converted into the signal OUTS, which has the potential VDDH at the high level and has the potential VSSH at the low level, by the level shift circuit 320, and the signal OUTS is output to the second circuit 20.

Both the protection circuit 330A and the protection circuit 330B are circuits provided for ESD countermeasures. As illustrated in FIG. 1, a configuration of the protection circuit 330A, which is the first protection circuit, is the same as a configuration of the protection circuit 330B which is the second protection circuit. Hereinafter, in a case where it is not necessary to distinguish between the protection circuit 330A and the protection circuit 330B, the protection circuit 330A and the protection circuit 330B are described as a "protection circuit 330". As illustrated in FIG. 1, the protection circuit 330 includes a diode 330a which is a first protection element, and a diode 330b which is a second protection element, and a resistor 330c. As illustrated in FIG. 1, the diode 330a and the diode 330b are interposed between the second high potential power line VDDH and the second low potential power line VSSH in series. More specifically, a first terminal (cathode) of the diode 330a is connected to the second high potential power line PVDDH, and a second terminal (anode) of the diode 330a is connected to a first terminal (cathode) of the diode 330b, a second terminal (anode) of the diode 330b is connected to the second low potential power line PVSSH, respectively. That is, the second high potential is supplied to the first terminal of the diode 330a as a high power source potential, and the second low potential is supplied to the second terminal of the diode 330b as a low power source potential.

A common connection point between the second terminal of the diode 330a and the first terminal of the diode 330b in the protection circuit 330 is an output end of a signal in the protection circuit 330. An output end of the protection circuit 330A is connected to the gate of the N-channel field effect transistor T40, and an output end of the protection circuit 330B is connected to the gate of the N-channel field effect transistor T20. The resistor 330c is connected to the output end and an input end of the signal from the combination circuit 310. More specifically, the resistor 330c of the protection circuit 330A is connected to the output end of the protection circuit 330A and an output end of the NOR gate 310c, and a resistor 330c of the first protection circuit 330B is connected to the output end of the first protection circuit 330 and the output end of the NOR gate 310c.

In each of the diode 330a and the diode 330b, a current flows in a direction from the second terminal to the first terminal in a case where a potential of the second terminal is higher than a potential of the first terminal. In the diode 330a, the ESD is generated on a low potential side (VDDL side). In a case where a positive high voltage pulse overlaps the first signal S1 or the second signal S2 and the potential of the second terminal is higher than the potential of the first terminal, a current according to the high voltage pulse flows to the second high potential power line VDDH. Therefore, the gate of the N-channel field effect transistor T20 or T40 is prevented from being damaged. In the diode 330b, the ESD is generated on the low potential side (VDDL side). In a case where a negative high voltage pulse is overlaps the first signal S1 or the second signal S2 and the potential of the second terminal is higher than the potential of the first terminal, the current according to the high voltage pulse is drawn from the second low potential power line VSSH and the current flows to the first low potential power line PVSSL. Therefore, the gate of the N-channel field effect transistor T20 or T40 is prevented from being damaged.

Hereinabove, the configuration of the level shifter 30 is described.

In the level shifter 30 according to the embodiment, an active element, such as the switch 280 or 290 disclosed in JP-A-2007-27676, is not provided on a low voltage side rather than the protection circuit 330. Therefore, the damage due to the generation of the ESD is not generated on the low voltage side. In addition, in the embodiment, under a situation in which the potential VDDH is not applied to the second high potential power line PVDDH, the enable signal EN is inactive, and thus both the first signal S1 and the second signal S2, which are output from the combination circuit 310, are at the low level (first low potential). As described above, in the embodiment, the first low potential is the same as the second low potential. Therefore, under a situation in which the ESD is not generated, the potential of the second terminal of the diode 330a is not higher than the potential of the first terminal in both the protection circuit 330A and the protection circuit 330B, and thus a leak current does not flow to the diode 330a. In the same manner, the potential of the second terminal of the diode 330b is not higher than the potential of the first terminal, and thus the leak current does not flow to the diode 330b.

According to the embodiment as described above, it is possible to avoid the leak current flowing through the protection circuit 330A and the protection circuit 330B, which are provided for the ESD countermeasures in the level shift circuit 320 that mediates signal transmission between the first circuit 10 and the second circuit 20 which have different supply voltages, and it is possible to intermittently operate the circuit (second circuit 20) on the high potential side.

Modification Example

Although the embodiment of the invention is described hereinabove, it is apparent that modifications below may be added.

In the embodiment, the first low potential power line PVSSL and the second low potential power line PVSSH are separate power lines, respectively. However, in a case where the first low potential (potential VSSL) is the same as the second low potential (potential VSSH), the first low potential power line PVSSL and the second low potential power line PVSSH may be provided as a common power line. In addition, it is not necessary that the first low potential is the same as the second low potential, and both the first low potential and the second low potential may be different. In a case where the first low potential is different from the second low potential, it is preferable that an absolute value of the potential difference between the first low potential and the second low potential is smaller than a forward voltage of the first protection element 330a and is smaller than a forward voltage of the second protection element 330b in order to reduce the leak current which flows through the first protection element 330a or the second protection element 330b in a case where the circuit (second circuit 20) on the high potential side is intermittently operated. The forward voltage of the protection element is a voltage between the second terminal and the first terminal of the protection element, and refers to a voltage acquired in a case where a current, which flows from the second terminal to the first terminal, rapidly increases. For example, in a case where both the forward voltage of the first protection element and the forward voltage of the second protection element are Vth, it is preferable to satisfy the following Equation (1).

$$|VSSH-VSSL|<vth$$

The second signal S2 may be set to have the same logical level as the input signal INS, and the first signal S1 may be set to a signal which is acquired by inverting the logical level of the input signal INS. Specifically, the output signal of the NOR gate 310b may be the first signal S1, and the output signal of the NOR gate 330c may be the second signal S2. In addition, a configuration of the combination circuit 310 is not limited to the configuration illustrated in FIG. 1. In brief, a circuit which has another configuration may be used in a case of a circuit in which the input signal INS from the first circuit 10 is input, one of the first signal S1 and the second signal S2 is set to have the same logical level as the input signal INS, and the other one is set to have an inverted logical level. In the same manner for the level shift circuit 320, a circuit which has another configuration may be used in a case of a circuit which outputs the signal OUTS, which has the second high potential at the high level and the second low potential at the low level, according to the first signal S1 and the second signal S2 which is acquired by logically inverting the first signal S1. Specifically, it is conceivable that the level shift circuit 250 disclosed in JP-A-2007-27676 is used.

Although the diode 330a is used as the first protection element and the diode 330b is used as the second protection element in the embodiment, a field effect transistor, to which the diode is connected, may be used.

Application Example

Figure 4:
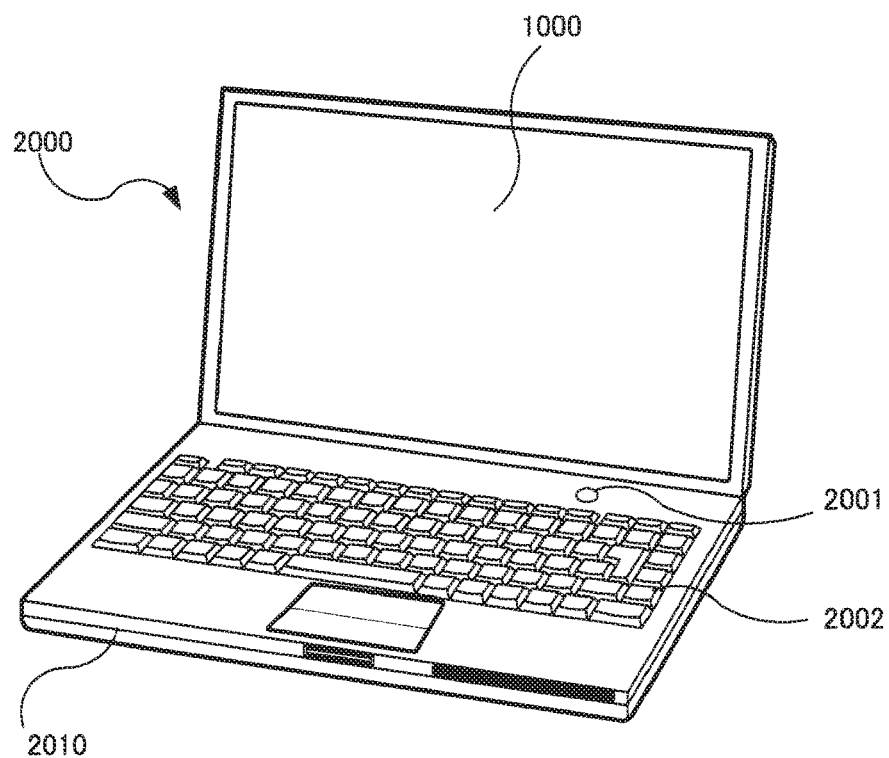
FIG. 4 is a perspective diagram illustrating a personal computer according to the invention.

Subsequently, an application example of the level shifter 30 according to the embodiment will be described. FIG. 4 is a diagram illustrating a configuration example of a mobile-type personal computer 2000 to which the level shifter 30 is applied. The personal computer 2000 includes a display unit 1000 and a main body unit 2010. The main body unit 2010 is provided with a power switch 2001 and a keyboard 2002. In the personal computer 2000, the level shifter 30 is used to mediate signal transmission between an image processing circuit (digital circuit), which processes image data indicative of an image to be displayed on the display unit 1000, and a driving circuit (analog circuit) which drives the display unit 1000. In addition, in a case where the personal computer 2000 has a wireless communication function, such as WI-FI, the level shifter 30 is also used for the signal transmission between a base band processing circuit (digital circuit) in a wireless communication unit, which realizes wireless communication, and a transmission/reception circuit (analog circuit) which transmits and receives radio waves.

Figure 5:
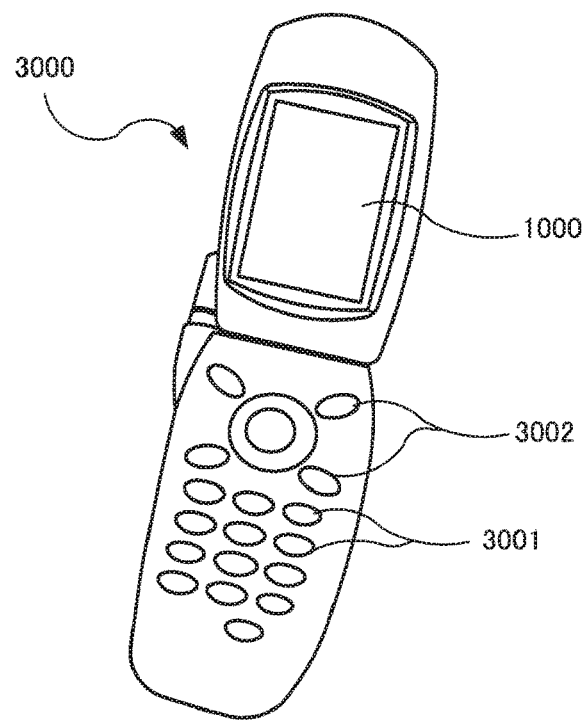
FIG. 5 is a perspective diagram illustrating a mobile phone according to the invention.

FIG. 5 is a diagram illustrating a configuration example of a mobile phone 3000 to which the level shifter 30 is applied. The mobile phone 3000 includes a plurality of operation buttons 3001 and scroll buttons 3002, and a display unit 1000. In a case where the scroll buttons 3002 are operated, a screen displayed on the display unit 1000 is scrolled. In the mobile phone 3000, the level shifter 30 is also used to mediate the signal transmission between an image processing circuit, which processes image data indicative of an image to be displayed on the display unit 1000, and a driving circuit which drives the display unit 1000. In addition, the level shifter 30 is also used for the signal transmission between a base band processing circuit in the wireless communication unit, which realizes the wireless communication in the mobile phone 3000, and a transmission/reception circuit which transmits and receives the radio waves.

Figure 6:
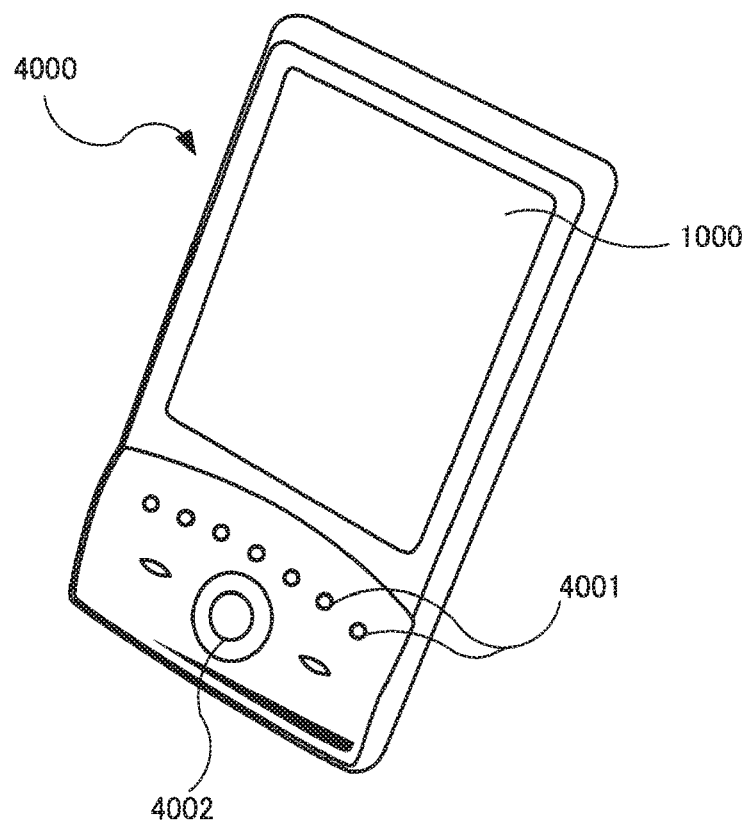
FIG. 6 is a perspective diagram illustrating a mobile information terminal according to the invention.
Figure 7:
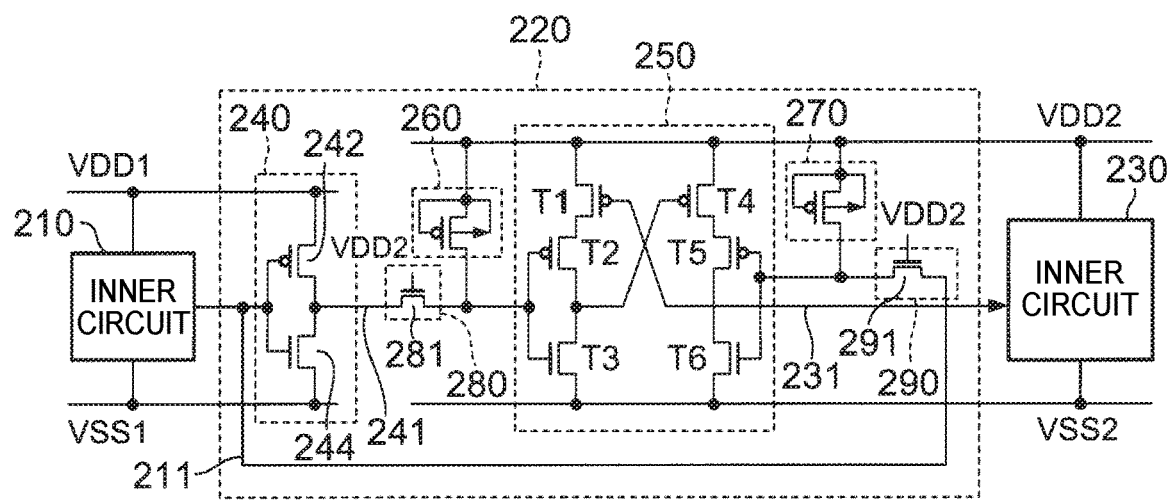
FIG. 7 is a diagram illustrating ESD countermeasures according to the related art in the level shifter.

FIG. 6 is a diagram illustrating a configuration example of a portable information terminal (Personal Digital Assistants (PDA)) 4000 to which the level shifter 30 is applied. The portable information terminal 4000 includes a plurality of operating buttons 4001, a power switch 4002, and a display unit 1000. In a case where the power switch 4002 is operated, various pieces of information, such as an address book or a schedule book, are displayed on the display unit 1000. In the portable information terminal 4000, the level shifter 30 is also used to mediate signal transmission between an image processing circuit, which processes image data indicative of an image to be displayed on the display unit 1000, and a driving circuit which drives the display unit 1000.

In addition to the apparatuses illustrated in FIGS. 4 to 6, a digital still camera, a liquid crystal television, a viewfinder-type or direct-view monitor-type video recorder, a car navigation apparatus, a pager, an electronic organizer, an electronic calculator, a word processor, a workstation, a video phone, a POS terminal, an apparatus having a touch panel, or the like may be exemplified as an electronic apparatus to which the level shifter 30 is applied. Meanwhile, the combination of the two circuits, in which the signal transmission is mediated by the level shifter 30, is not limited to the combination of the digital circuit and the analog circuit. In brief, circuits which have different supply voltages may be used.

What is claimed is:

1. A level shifter that receives an input signal, which has a first high potential at a high level and a first low potential at a low level, from a first circuit, performs level shift on the input signal, and outputs an output signal, which has a second high potential at the high level and a second low potential at the low level, to a second circuit, the level shifter comprising:
a combination circuit to which the first high potential and the first low potential are applied as power source potentials, and which outputs a first signal and a second signal; and
a level shift circuit to which the second high potential and the second low potential are applied as the power source potentials, and which generates the output signal according to the first signal and the second signal,
wherein the second high potential is higher than the first high potential,
wherein an enable signal is applied to the combination circuit, which has a logical level that is active in a case where the second high potential is applied to the level shift circuit and which has a logical level that is inactive in a case where the second high potential is not applied to the level shift circuit, and
wherein the combination circuit causes both the first signal and the second signal to be at the low level in a case where the enable signal is inactive, and causes one of the first signal and the second signal to be at the high level and the other signal to be at the low level in a case where the enable signal is active.

2. The level shifter according to claim 1,
wherein the combination circuit
outputs the first signal, which has a logical level that is the same as a logical level of the input signal in a case where the enable signal is active, and outputs the first signal, which has a logical level at the low level in a case where the enable signal is inactive, and
outputs the second signal which has a logical level acquired by inverting the logical level of the input signal in a case where the enable signal is active, and outputs the second signal which has a logical level at the low level in a case where the enable signal is inactive.

3. The level shifter according to claim 2,
wherein the enable signal is at the high level in a case where the enable signal is active, and
wherein the combination circuit includes
an inverter to which the enable signal is input,
a first NOR gate to which the input signal and an output signal of the inverter are input, and which outputs the second signal, and
a second NOR gate to which the output signal of the first NOR gate and the output signal of the inverter are input, and which outputs the first signal.

4. The level shifter according to claim 1, further comprising:
a first protection circuit which is connected to an output end of the first signal in the combination circuit and an input end of the first signal in the level shift circuit; and
a second protection circuit which is connected to an output end of the second signal in the combination circuit and an input end of the second signal in the level shift circuit,
wherein each of the first protection circuit and the second protection circuit includes
a resistor that is connected to an input end of the signal which is output from the combination circuit and an output end of a signal which is output to the level shift circuit, and
a first protection element that includes a first terminal to which the second high potential is supplied as a high power source potential, and a second terminal which is connected to the output end of the signal to be output to the level shift circuit, and that causes a current to flow in a direction from the second terminal to the first terminal in a case where a potential of the second terminal is higher than a potential of the first terminal, and
a second protection element that includes a first terminal which is connected to the output end of the signal to be output to the level shift circuit, and a second terminal to which the second low potential is supplied as a low power source potential, and that causes the current to flow in a direction from the second terminal to the first terminal in a case where the potential of the second terminal is higher than the potential of the first terminal, and wherein an absolute value of a potential difference between the first low potential and the second low potential is smaller than a forward voltage of the first protection element and is smaller than a forward voltage of the second protection element.

5. The level shifter according to claim 1,
wherein the first low potential is the same as the second low potential.

6. An electronic apparatus comprising the level shifter according to claim 1.

7. An electronic apparatus comprising the level shifter according to claim 2.

8. An electronic apparatus comprising the level shifter according to claim 3.

9. An electronic apparatus comprising the level shifter according to claim 4.

10. An electronic apparatus comprising the level shifter according to claim 5.

\* \* \* \* \*